United States Patent
Felder et al.

(10) Patent No.: US 7,583,216 B2
(45) Date of Patent: Sep. 1, 2009

(54) ADJUSTABLE DAC AND APPLICATIONS THEREOF

(75) Inventors: Matthew D. Felder, Austin, TX (US); Marcus W. May, Austin, TX (US); Michael R. May, Austin, TX (US)

(73) Assignee: Sigmatel, Inc., Austin, TX (US)

( * ) Notice: Subject to any disclaimer, the term of this patent is extended or adjusted under 35 U.S.C. 154(b) by 0 days.

(21) Appl. No.: 11/863,631

(22) Filed: Sep. 28, 2007

(65) Prior Publication Data

US 2009/0085782 A1    Apr. 2, 2009

(51) Int. Cl.
*H03M 1/66* (2006.01)
(52) U.S. Cl. .................. 341/144; 341/136
(58) Field of Classification Search ............ 341/136, 341/144

See application file for complete search history.

(56) References Cited

U.S. PATENT DOCUMENTS

| | | | | |
|---|---|---|---|---|
| 6,329,940 | B1 * | 12/2001 | Dedic | 341/144 |
| 6,998,871 | B2 * | 2/2006 | Mulligan | 326/37 |
| 7,019,676 | B2 * | 3/2006 | Ikoma et al. | 341/144 |
| 7,109,745 | B2 * | 9/2006 | Mulligan | 326/37 |
| 7,129,743 | B2 * | 10/2006 | Mulligan | 326/37 |

* cited by examiner

*Primary Examiner*—Khai M Nguyen

(57) ABSTRACT

A digital to analog converter (DAC) includes at least one digital to analog conversion module and a gated termination. The at least one digital to analog conversion module is coupled to convert at least one bit of a digital signal into an analog signal. The gated termination is coupled to an analog output of the at least one digital to analog conversion module to provide a first termination when a termination selection signal is in a first state and to provide a second termination when the termination selection signal is in a second state.

20 Claims, 7 Drawing Sheets

ADJUSTABLE DAC AND APPLICATIONS THEREOF

CROSS REFERENCE TO RELATED PATENTS

Not applicable

STATEMENT REGARDING FEDERALLY SPONSORED RESEARCH OR DEVELOPMENT

Not applicable

INCORPORATION-BY-REFERENCE OF MATERIAL SUBMITTED ON A COMPACT DISC

Not applicable

BACKGROUND OF THE INVENTION

1. Technical Field of the Invention

This invention relates generally to mixed signal circuitry and more particularly to digital to analog converters.

2. Description of Related Art

In general, a system on a chip (SOC) integrates multiple independent circuits, which are typically available as individual integrated circuits, on to a single integrated circuit. For example, a multimedia (e.g., audio, video, graphics, and/or text) processing SOC combines a processing core (e.g., microprocessor and/or digital signal processor, instruction cache, and data cache), an audio codec (e.g., digitization of analog audio input signals and converting digitized audio signals into analog output signals), a high speed serial interface (e.g., universal serial bus (USB) interface), a display interface, a video decoder, video digital to analog converters (DACs), and an external memory interface.

In a multimedia SOC, the video decoder outputs a digital video signal in a component, composite, or S-video format. One or more of the video DACs converts the digital video signal into an analog video signal, which is provided to one or more off-chip video output jacks. Typically, one or more 75 Ohm cables are coupled to the one or more off-chip video output jacks to provide the analog video signal to an analog video display, which has a load impedance of 75 Ohms. To provide impedance matching, the output of each video DAC is terminated with a 75 Ohm load, which may be on chip or off chip. This, however, requires sufficient power to drive the 75 Ohm load and the 75 Ohm termination.

To reduce the power requirements, short video cables (e.g., less than 0.5 meter) may be used such that the 75 Ohm termination may be omitted. While this reduces the power requirements for the video output, it does so at the cost of requiring short video cables, which may be impractical for many uses of the SOC.

Since the analog video signal may be outputted on one or more video output jacks, it is desirous to only activate the video DACs that are connected to a cable. As such, many multimedia SOCs include jack sense circuitry to detect when a cable is coupled to a particular jack. A known embodiment of a jack sense circuit includes a pull up resistor, a mechanical switch, and use of a general purpose input/output (GPIO) pin. When a cable is plugged into a jack, the mechanical switch is closed, coupling the pull up resistor to ground. The GPIO pin is coupled to the common node of the mechanical switch and the pull up resistor, which, in this state, is coupled to ground via the closed mechanical switch. When a cable is not connected to the jack, the mechanical switch is open and the pull up resistor is floating. The GPIO pin is pulled up to Vdd via the pull-up resistor to indicate that no cable is connected to the jack.

While the above described jack sense circuit works to detect whether a cable is plugged into a jack, it requires the use of a GPIO pin and a pull up resistor for each of the video DAC outputs. In addition, the jack sense circuit only detects whether a cable is plugged into a jack; it does not detect whether other end is coupled to a load, or whether the load is a video display or headphones. As such, if a floating cable is connected to a jack, the jack sense circuit provides a positive indication, which is used to enable the corresponding video DAC. This wastes power since the enable video DAC is not being used since the cable is not connected to a video display.

Therefore a need exists for a multimedia SOC that includes an improved jack sense circuit and/or includes a more efficient video DAC.

BRIEF DESCRIPTION OF THE SEVERAL VIEWS OF THE DRAWING(S)

DETAILED DESCRIPTION OF THE INVENTION

Figure 1:
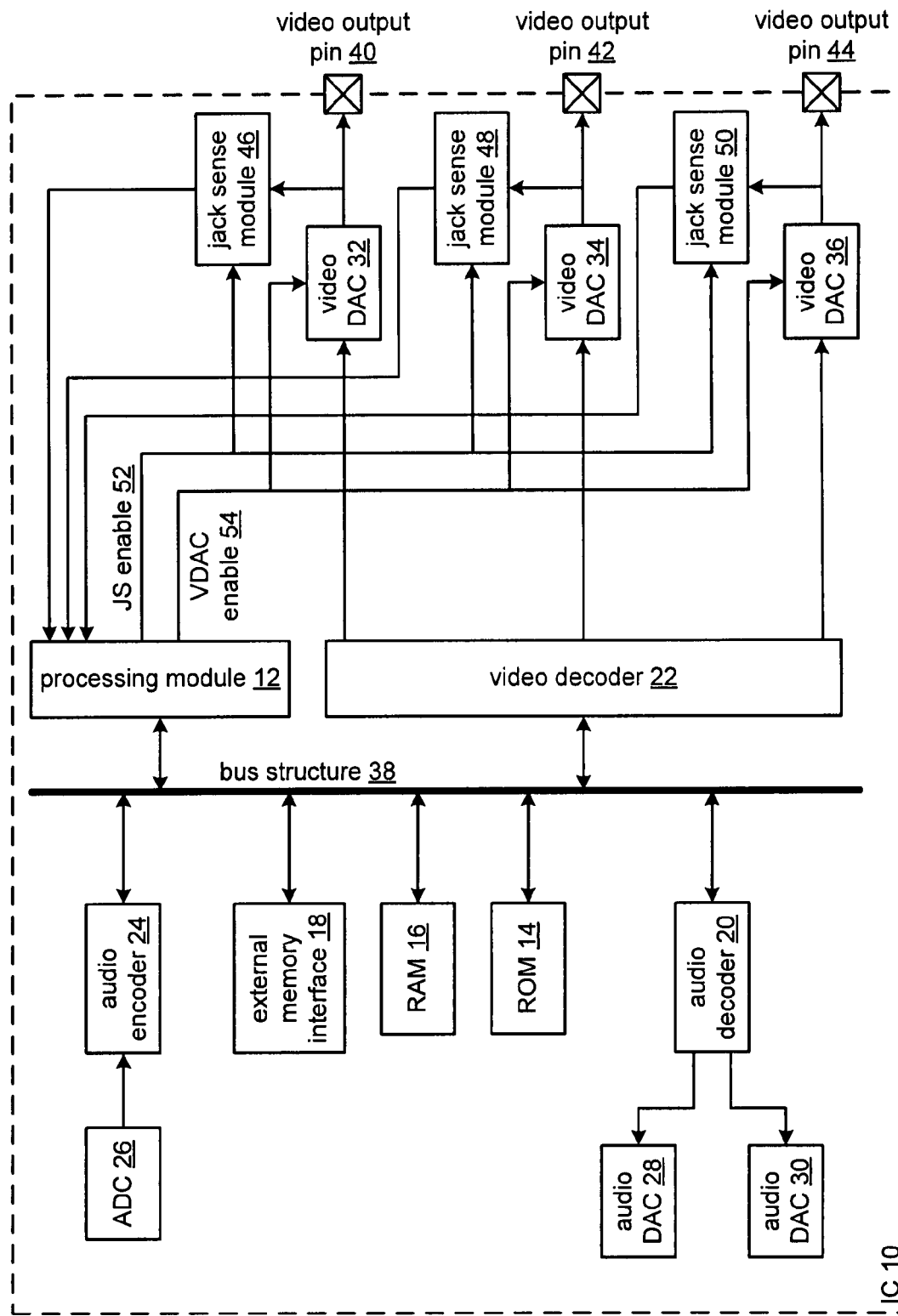
FIG. 1 is a schematic block diagram of an embodiment of a multimedia system on a chip (SOC) in accordance with the present invention.

FIG. 1 is a schematic block diagram of an embodiment of a multimedia system on a chip (SOC) 10 that includes a processing module 12, read only memory (ROM) 14, random access memory (RAM) 16, an external memory interface 18, an audio decoder 20, a video decoder 22, an audio encoder 24, at least one an analog to digital conversion (ADC) module 26, at least one audio digital to analog conversion (DAC) module 28-30 (two shown for left and right channel), a plurality of video DAC modules 32-36 (three shown), a bus structure 38, a plurality of video output pins 40-44, and a plurality of jack sense modules 46-50. Note that the SOC 10 may further include a host interface such as a universal serial bus (USB). Further note that the audio decoder 20, the video decoder 22, and/or the audio encoder 24 may be separate processing modules and/or included within the processing module 12.

Processing module 12 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module may have an associated memory and/or memory element, which may be a single memory device, a plurality of memory devices, and/or embedded circuitry of the processing module. Such a memory device may be a read-only memory, random access memory, volatile memory, non-volatile memory, static memory, dynamic memory, flash memory, cache memory, and/or any device that stores digital information. Note that when the processing module implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Further note that, the memory element stores, and the processing module executes, hard coded and/or operational instructions corresponding to at least some of the steps and/or functions illustrated in FIGS. 1-8.

In a video playback mode, the video decoder 22 independently, and/or under the control of the processing module 12, retrieves a stored video file. The video file may be stored in on-chip memory and/or off-chip memory, where the off-chip memory is accessed via the external memory interface 18. Upon retrieving the stored video file, or a portion thereof, the video decoder 22 decodes the file to produce a digital video signal. The decoding may be in accordance with a video coding protocol such as one or more versions of MPEG (motion picture expert group), may be in accordance with a proprietary video coding protocol, and/or any other type of video decompression.

Depending on the type of video file and/or upon the selected video coding protocol, the video decoder 22 will produce a composite video output, an S-video output, a component video output, and/or other type of video output format. As is known, composite video is provided as a single signal, S-video is provided as two signals (e.g., brightness and color), and component video is provided as two or more signal components (e.g., YPrBr and/or RGB). Thus, the video decoder 22 will output one or more signals in accordance with the particular video format.

In an embodiment, the jack sense modules 46-50, when enabled by the processing module 12 via a jack sense enable signal 52, determine whether a cable is connected to the corresponding video output pin 40-44. Based on the number of cables connected to the corresponding pins 40-44, the processing module 12 determines the particular video format. For example, if one cable is connected, the processing module 12 determines that the video format should be composite video; if two cables are connected, the processing module 12 determines that the video format should be S-video; and if three cables are connected, the processing module 12 determines that the video format should be component video. Upon make this determination, the processing module 12 provides an indication to the video decoder 22 such that the video decoder 22 processes the stored video file in accordance with the desired video output format.

In addition, the processing module 12 may enable only the video DAC modules 32-34 that are needed for the corresponding video output format. For example, when the video output format is composite video, only one video DAC module needs to be enabled; when the video output format is S-video, two video DAC modules need to be enabled; and when the video output format is component video, three video DAC modules need to be enabled. In addition, when no cable connections are detected, the processing module 12 may disable the video decoder 22 and the video DAC modules 32-34.

As such, only the circuitry that is needed to support the video output connections is enabled, thereby reducing power consumption.

In an audio playback mode, the audio decoder 20 independently, and/or under the control of the processing module 12, retrieves a stored audio file or audio portion of a video file. The audio and/or video file may be stored in on-chip memory and/or off-chip memory, where the off-chip memory is accessed via the external memory interface 18. Upon retrieving the stored audio file, or a portion thereof, the audio decoder 20 decodes the file to produce a digital audio signal. The decoding may be in accordance with an audio coding protocol such as one or more versions of MPEG (motion picture expert group), may be in accordance with a proprietary audio coding protocol, and/or any other type of audio decompression.

The audio decoder 20 provides the digital audio signal to one or more of the audio DACs 28-30. The audio DACs 28-30 convert the digital audio signal into an analog audio signal, which is provided off chip to one or more speaker jacks and/or headphone jacks. While not shown, the SOC 10 may further include volume adjust circuitry coupled to the output of the audio DACs 28-30 to adjust the volume of the outputted analog audio signals.

Figure 2:
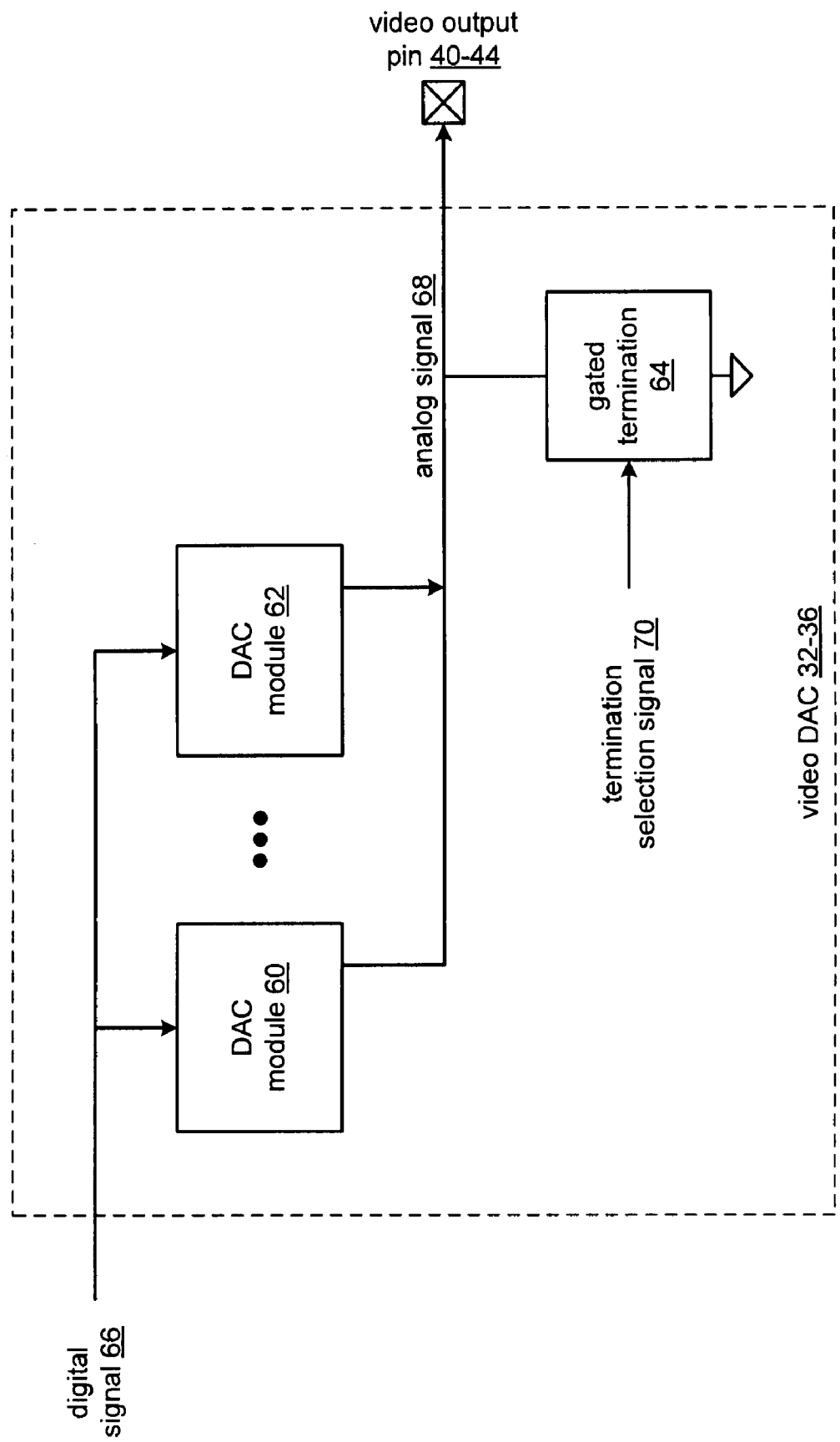
FIG. 2 is a schematic block diagram of an embodiment of a video digital to analog converter (DAC) in accordance with the present invention.

FIG. 2 is a schematic block diagram of an embodiment of a video digital to analog converter (DAC) module 32-36 that includes one or more digital to analog (DAC) modules 60-62 and a gated termination 64. The one or more digital to analog conversion modules 60-62 (embodiments of which will be described in greater detail with reference to FIGS. 3 and 4) is coupled to convert at least one bit of a digital signal 66 into an analog signal 68. One or more of the video output pins 40-44 outputs the analog signal 68.

The gated termination 64 (embodiments of which will be described in greater detail with reference to FIGS. 3 and 4) is coupled to the analog output of the one or more digital to analog conversion modules 60-62 and is coupled to receive a termination selection signal. When the termination selection signal 70 is in a first state (e.g., single termination mode), the gated termination 64 provides a first termination and, when the termination selection signal is in a second state (e.g., double termination mode), the gated termination 64 provides a second termination.

Figure 3:
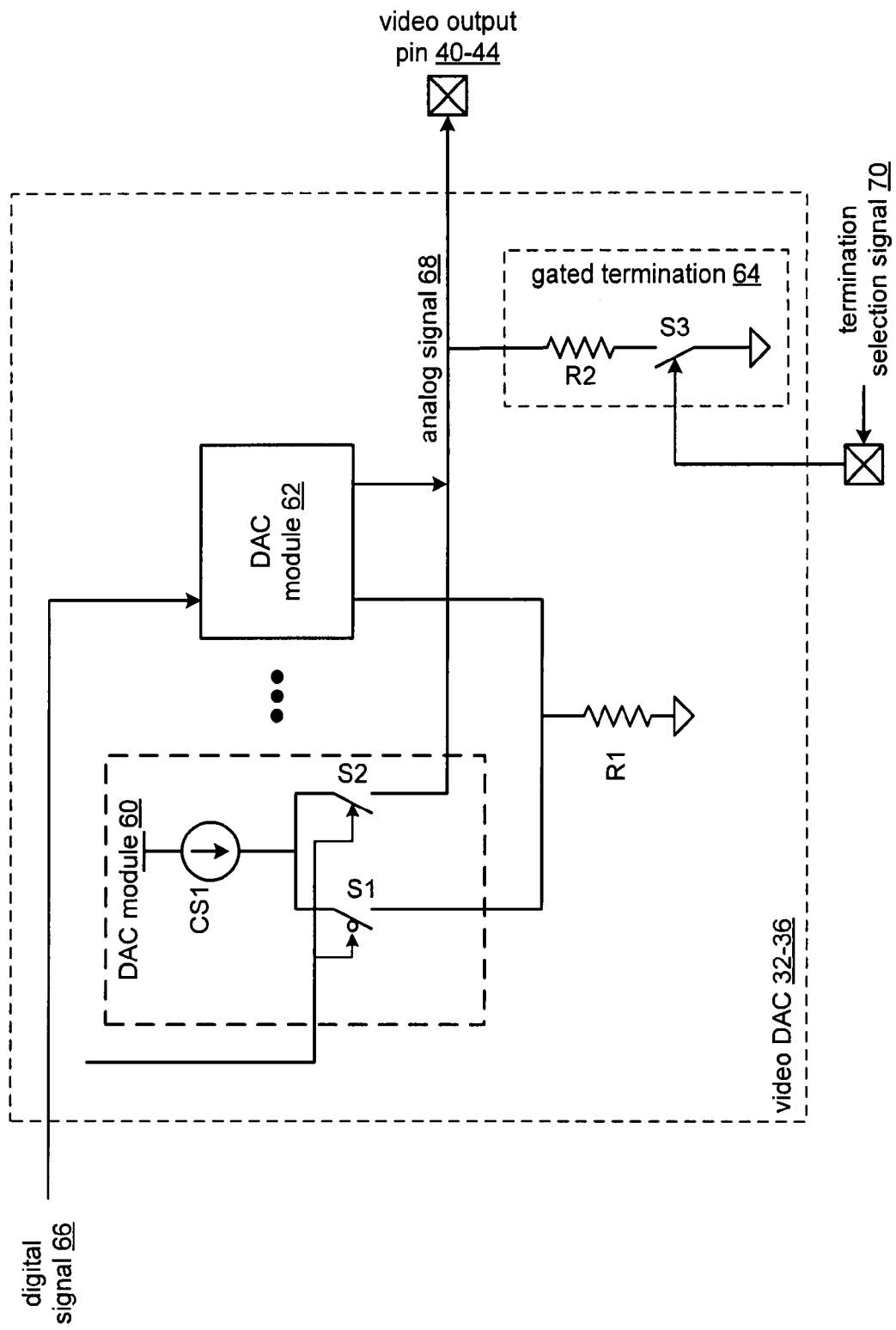
FIG. 3 is a schematic block diagram of another embodiment of a video digital to analog converter (DAC) in accordance with the present invention.

FIG. 3 is a schematic block diagram of another embodiment of a video digital to analog converter (DAC) module 32-36 that includes the one or more digital to analog (DAC) modules 60-62, a shared dump impedance R1 (note that each DAC module 60 could include its own dump impedance) and the gated termination 64. Each of the DAC modules 60-62 includes a current source (CS1) and switches (S1 and S2). The gated termination 64 includes a switch (S3) and an impedance (R2).

In operation, when a bit of the digital signal 66 is in a first state (e.g., logic 0), switch S1 is closed and switch S2 is open such that the current of the current source SC1 is steered to the dump impedance R1, which may be a resistor, a transistor, inductor, and/or capacitor, to ground. When the bit of the digital signal 66 is in a second state (e.g., logic 1), switch S1 is open and switch S2 is closed such that the current of the current source CS1 is provided to the analog output to provide at least a portion of the analog signal 68. Note that each DAC module 60-62 may have a different valued current source to provide differing levels of digital to analog conversion and/or the DAC modules 60-62 may have the same valued current sources that drive a resistor divider to provide the differing levels of digital to analog conversion. For example, a 4-bit digital to analog converter includes 4 DAC modules, where a first DAC module corresponds to the most significant bit (MSB) of a 4-bit digital value; a second DAC module corresponding to the second MSB of the 4-bit digital value; a third DAC module corresponding to the third MSB of the 4-bit digital value; and a fourth DAC module corresponding to the least significant bit (LSB) of the 4-bit digital value. In this example, the first DAC module provides ½ or 0 of a full scale analog current signal based on the MSB, the second DAC module provides ¼ or 0 of a full scale analog current signal based on the second MSB, the third DAC module provides ⅛ or 0 of a full scale analog current signal based on the third MSB, and the fourth DAC module provides 1/16 or 0 of a full scale analog current signal based on the LSB. As another example, a DAC may include multiple (e.g., 15) DAC modules of the same size using a thermometer code scheme to produce a desired analog output. In yet another example, a DAC may be segmented to include some modules having binary coding (e.g., 6 modules) and some thermometer coding (e.g., 6 modules).

In an alternative embodiment, the current sources (e.g., CS1) may be a variable current source that provides a first current when the termination selection signal 70 is in the first state and provides a second current when the termination selection signal is in the second state 70. For example, if the first state corresponds to a single termination mode (e.g., no impedance matching on the chip side of the video cable), the current source is adjusted to provide approximately of 15/n milli-amps, where n is the number of thermometer coded modules. Continuing with this example, if the second state corresponds to a double termination mode (e.g., includes impedance matching on the chip side of the video cable), the current source is adjusted to provide approximately 30/n milli-amps. In general, the current source provides about ½ the current in the single termination mode as it does in the double termination mode.

As shown, the gated termination includes an impedance R2 (e.g., a resistor, a transistor, a capacitor, and/or an inductor) and a switch S3. The switch S3 is controlled by the termination selection signal 70, which may be received via an input pin of the SOC. When the termination selection signal 70 is in the first state (e.g., no impedance matching on the chip side of the video cable for a single termination mode), the switch S3 is open to provide the first termination (e.g., an open circuit which has no load) and, when the termination selection signal is in the second state (e.g., includes impedance matching on the chip side of the video cable for a double termination mode), the switch S3 is closed to provide the second termination (e.g., 75 Ohms).

Figure 4:
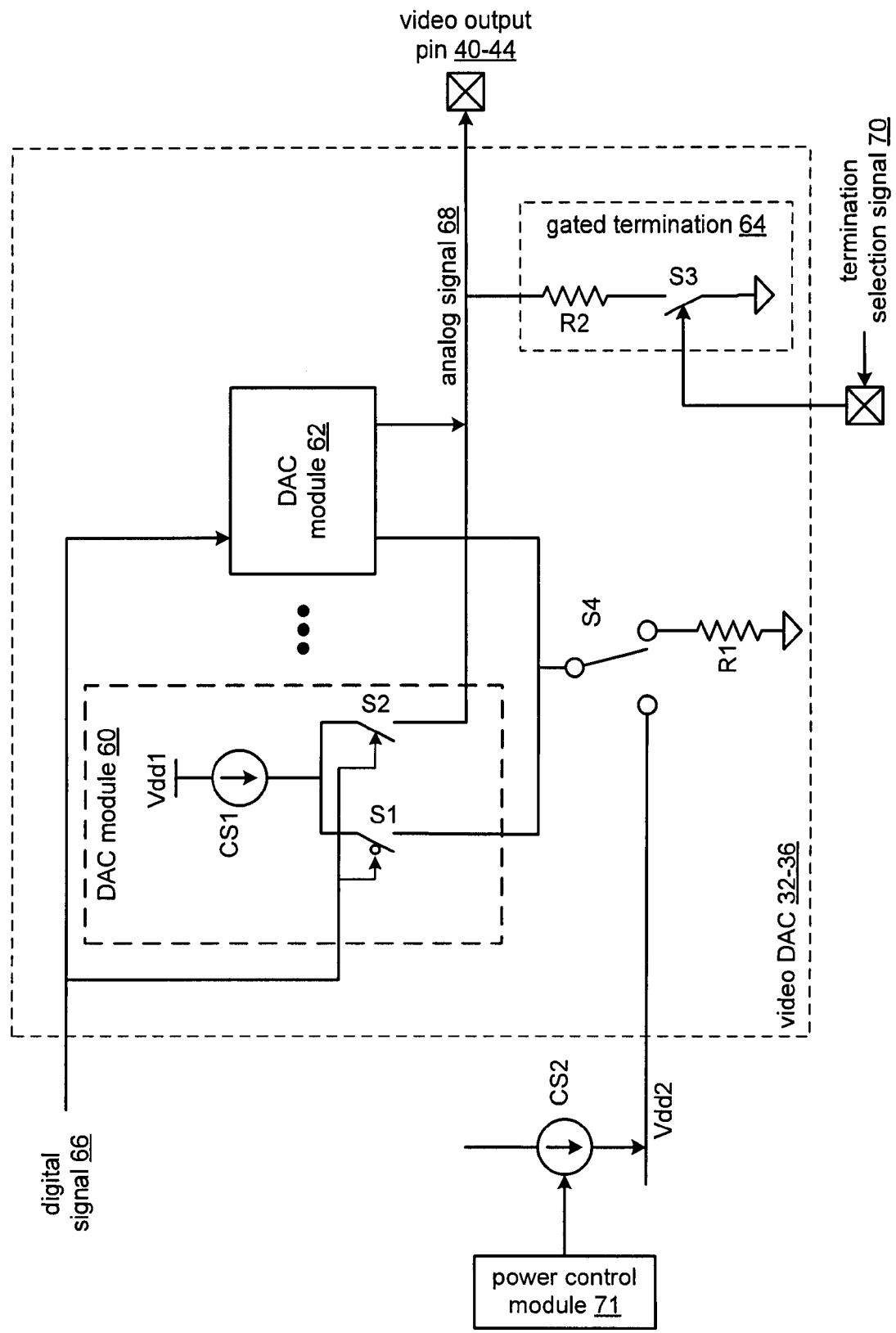
FIG. 4 is a schematic block diagram of another embodiment of a video digital to analog converter (DAC) in accordance with the present invention.

FIG. 4 is a schematic block diagram of another embodiment of a video digital to analog converter (DAC) module 32-36 that includes the one or more digital to analog (DAC) modules 60-62, a dump impedance R1, a switch S4, and the gated termination 64. Each of the DAC modules 60-62 includes a current source (CS1) and switches (S1 and S2). The gated termination 64 includes a switch (S3) and an impedance (R2). In an embodiment, R1 is a variable resistor having a resistance approximately ½ of the resistance of R2 in a double termination mode and having a resistance approximately equal to the resistor of R2 in a single termination mode. In an alternative embodiment, each DAC module 60-62 may include its own dump impedance, where the parallel combination equates to R1.

In this embodiment, switch S4 directs the current of the dump nodes of the DAC modules 60-62 to either the dump impedance R1 or to a second supply voltage Vdd2. When in a dump to VDD mode, switch S4 couples the dump nodes of the DAC modules 60-62 to the second supply voltage Vdd2, which may be at least partially produced by current source CS2. For instance, current source CS1 is supplied by supply voltage Vdd1, which is of a greater value than Vdd2. In this manner, the energy that is dumped by the DAC modules is substantially recaptured and used for another supply voltage (e.g., Vdd2). For example, approximately ⅔rds of the energy dumped into the dump impedance can be recaptured in this manner.

Since energy is being recovered and used for the second supply voltage, the source of the second supply voltage can be scaled back. To achieve this, a power control module 71 is coupled to regulate the current provided by a second current source CS2 associated with the second supply voltage source. Note that the power control module 71 may be a stand alone processing module or included with processing module 12 and that it may provide a control signal to the second current source to regulate the current provided by the second current source CS2. Further note that the second supply voltage may be provided by a DC-DC converter that has its regulation adjusted based on the current dumped by the DAC modules. Still further note that the switches S1-S3 may be implemented via switches, transistors, gated circuits, etc.

Figure 5:
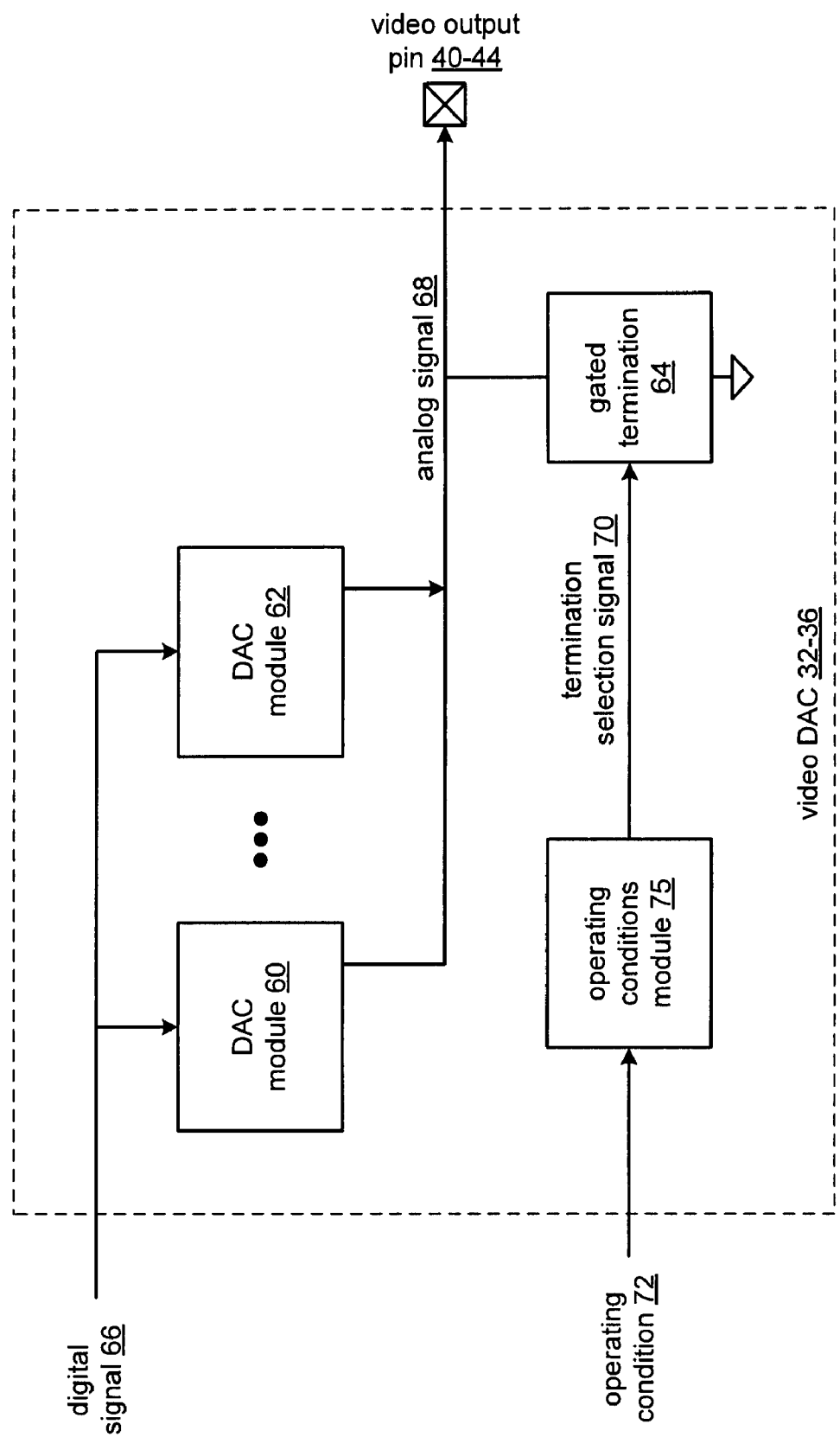
FIG. 5 is a schematic block diagram of another embodiment of a video digital to analog converter (DAC) in accordance with the present invention.

FIG. 5 is a schematic block diagram of another embodiment of a video digital to analog converter (DAC) module 32-36 that includes one or more digital to analog (DAC) modules 60-62, the gated termination 64, and an operating conditions module 75. In this embodiment, the operating conditions module 75, which may be a stand alone module or included within processing module 12, determines the termination selection signal 70 based on operating conditions 72. The operating conditions 72 may include cable length, signal quality, video type, bandwidth, load impedance, etc.

As an example, when the connected video cable is short (e.g., less than 0.5 meters), the operating conditions module 75 determines that the first state (e.g., single termination mode) of the termination selection signal 70 will provide an acceptable termination level. As another example, when the connected video cable is long, the operating conditions module 75 determines that the second state (e.g., double termination mode) of the termination selection signal 70 will provide an acceptable termination level. Note that while the video DACs of FIGS. 3-5 are shown as having a single ended output, each DAC could have a different output. In this instance, the current would be dumped to ground.

Figure 6:
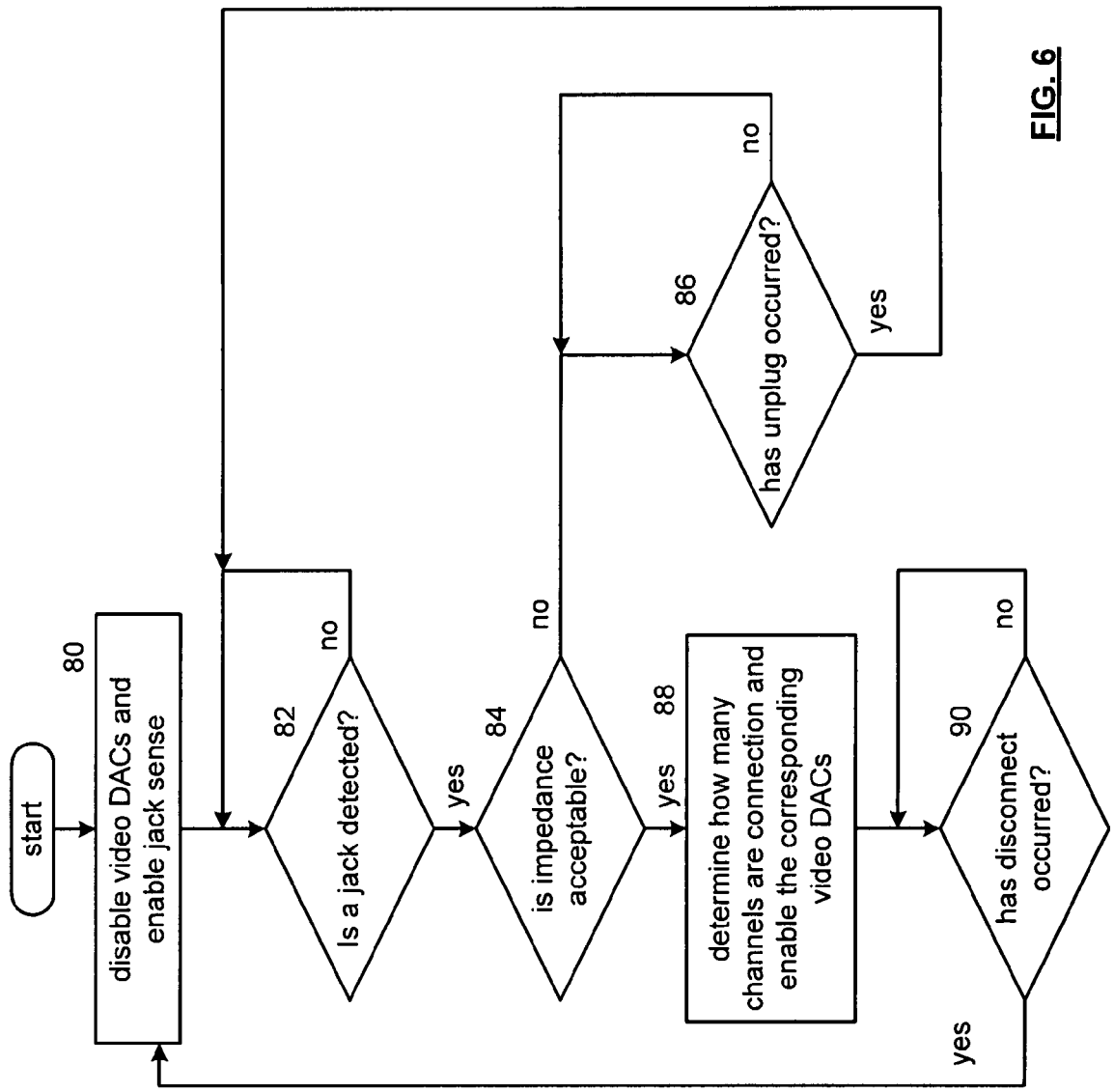
FIG. 6 is a logic diagram of an embodiment of a method of power reduction via jack sensing in accordance with the present invention.

FIG. 6 is a logic diagram of an embodiment of a method of power reduction via jack sensing that begins at step 80 when the processing module 12 disables the video DACs and enables one or more of the jack section modules. The method then proceeds to step 82 where the processing module determines, via the one or more enabled jack sense sections, whether a video cable is connected to a corresponding video jack. If not, the method loops until at least one video cable connection is detected.

If at least one video cable connection is detected, the method proceeds to step 84 where the processing module determines whether the impedance of the cable connection is acceptable. For example, a typical video cable has an impedance of 75 Ohms, a headphone set has an impedance of 50 Ohms, an open circuit has a large impedance, and a short has an impedance near 0 Ohms. If an impedance of approximately 75 Ohms is detected, the impedance will be deemed acceptable. If a lower value (e.g., 50 Ohms or near 0 Ohms) is detected, then the impedance will be deemed to be unacceptable. Similarly, if a large impedance is detected (e.g., an open circuit), then this impedance is also deemed to be unacceptable. If an unacceptable impedance is detected, the process proceeds to step 86 where the processing module determines whether the video connection has come unplugged. If so, the method loops back to step 82. If the connection has not become unplugged, the method waits until an acceptable impedance is detected. Note that this is done for each enabled jack sense module.

If the impedance of each video connection is acceptable, the method proceeds to step 88 where the processing module determines how many channels are connected and enables a corresponding number of video DACs. Note that composite video typically uses one video connection, S-video typically uses two video connections, and component video typically uses three video connections.

The method then proceeds to step 90 where the processing module monitors the one or more video connections to determine whether one or more of the connections has disconnected. If, the method continues to monitor for a disconnection of one or more video cables. If a disconnection is detected, the method reverts to step 80.

Figure 7:
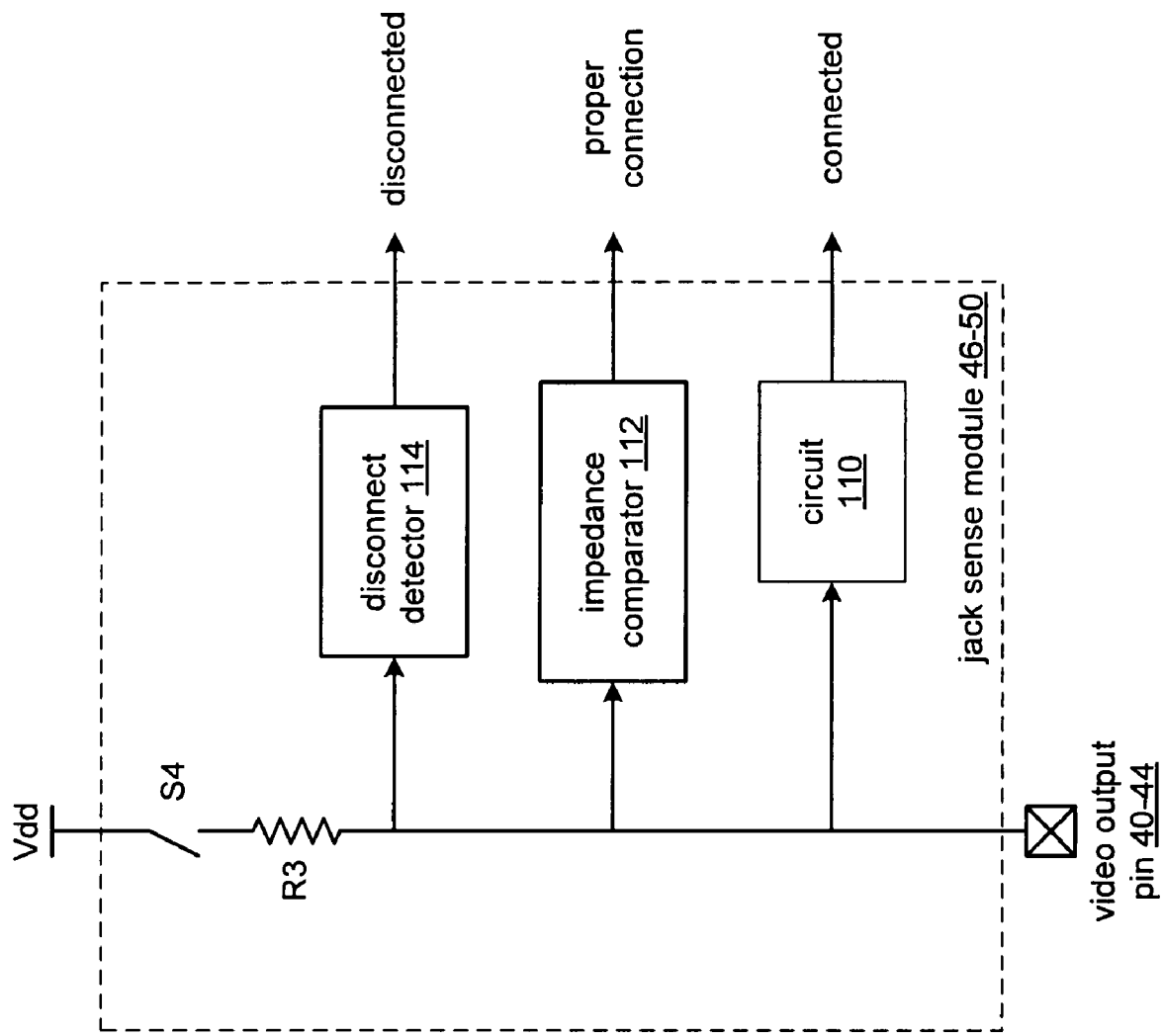
FIG. 7 is a schematic block diagram of an embodiment of a jack sensing module in accordance with the present invention.

FIG. 7 is a schematic block diagram of an embodiment of a jack sensing module 46-50 that includes a switch S4, an impedance R3, a circuit 110 (which may be implemented by a logic gate having an inherent trip voltage approximating a reference voltage or a comparator comparing the voltage on the video output pin to a voltage reference), an impedance comparator 112, and a disconnect detector 114. The impedance R3 may be a pull up resistor that is coupled to one of the video output pins 40-44. In operation, when the switch S3 is closed via a signal from the processing module 12, the pull up resistor R3 is coupled to Vdd. If no load is present on the corresponding video output pin 40-44, the input of the circuit 110 will be pulled high. In this state, the circuit 110 will indicate that no load is coupled to the video output pin 40-44.

In addition, the disconnect detector 114 will indicate a disconnection (i.e., a connection is not currently made) and the impedance comparator 112 will indicate a high impedance or an improper impedance. For example, a proper video connection will have an impedance of approximately 75 Ohms (or some other known impedance). When no connection is made, the video pin 40 or 44 will have a large impedance value. When compared to the desired 75 Ohms, the impedance comparator 112 will indicate the mismatch as either a high impedance or simply as an improper impedance.

If, however, a load is present on the corresponding video output pin 40-44, then the input of the circuit 110 will be low. In this state, the circuit 110 will indicate that a load is coupled to the video output pin 40-44. In addition, the impedance comparator 112 will provide a proper connection indication if the connection has the desired impedance (e.g., 75 Ohms) or will provide an improper connection indication if the connection has an impedance not substantially equal to the desired impedance. For example, if the video connection is a short, the comparator 110 will indicate a connection, but the impedance comparator 114 will indicate an improper connection. In this instance, the processing module may disable the video decoder and/or the video DACs.

In another embodiment, the pull up resistor R3 may be sized to detect the type of load coupled to the video output pin 40-44. For example, a headphone has an impedance of about 50 Ohms while a video display has an impedance of approximately 75 Ohms. Thus, the pull up resistor R3 could be sized to provide a positive result when the 75 Ohm load is coupled thereto and a negative result when the 50 Ohm load is coupled thereto. Alternatively, the impedance comparator 114 may include multiple levels of comparison to indicate no load, a 50 Ohm load, a short, a 75 Ohm load, etc.

While the preceding discussion has been presented for a video DAC perspective, the teachings of the present invention may be used for any DAC application. In addition, the teachings of the present invention may be used in any combination to reduce power consumption of a multimedia SOC and/or provide a desired level of video output performance.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled to" and/or "coupling" and/or includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" indicates that an item includes one or more of power connections, input(s), output(s), etc., to perform one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

What is claimed is:

1. A digital to analog converter (DAC) comprises:
at least one digital to analog conversion module coupled to convert at least one bit of a digital signal into an analog signal, the digital to analog converter comprising:
a first current source coupled to a first supply voltage source;
a first switch; and
a second switch, wherein, when the at least one bit is in a first state, the first switch is enabled to steer current of the first current source to a dump node and, when the at least one bit is in a second state, the second switch is enable to steer the current of the first current source to an analog output;
a third switch operable to couple the dump node to a second supply voltage source when the at least one bit is in the first state, wherein voltage of the second supply voltage source is less than a voltage of the first supply voltage source and
a power regulator that produces the second supply voltage, wherein the power regulator responds accordingly to maintain regulation of the second supply voltage as the current from the dump node changes; and
a gated termination coupled to the analog output of the at least one digital to analog conversion module to provide a first termination when a termination selection signal is in a first state and to provide a second termination when the termination selection signal is in a second state.

2. The DAC of claim 1, wherein the current source comprises:
a variable current source that provides a first current when the termination selection signal is in the first state and provides a second current when the termination selection signal is in the second state.

3. The DAC of claim 1, wherein the gated termination comprises:
an impedance; and
a switch coupled in a series with the impedance, wherein, when the termination selection signal is in the first state, the switch is open to provide the first termination and, when the termination selection signal is in the second state, the switch is closed to provide the second termination.

4. The DAC of claim 1 further comprises:
an input for receiving the termination selection signal.

5. The DAC of claim 1 further comprises:
an operating conditions module coupled to:
determine at least one operating condition of the DAC; and
generate the termination selection signal based on the at least one operating condition.

6. The DAC of claim 1, wherein the digital signal comprises video data.

7. The DAC of claim 1, further comprising:
a bus coupled to the at least one digital to analog conversion module;
a random access memory coupled to the bus; and
a processing module coupled to the bus.

8. The DAC of claim 7, further comprising:
an audio DAC module coupled to the bus.

9. A digital to analog converter (DAC) comprises:
a plurality of digital to analog conversion modules coupled to convert a digital signal into an analog signal, wherein a digital to analog conversion module of the plurality of digital to analog conversion modules includes:
a current source coupled to provide a first current when the DAC is in a first mode and to provide a second current when the DAC is in a second mode, wherein the second current is greater than the first current;
a first switch;
a second switch, wherein, when at least one bit of the digital signal is in a first state, the first switch is enabled to steer the first or second current to a dump node and, when the at least one bit is in a second state, the second switch is enable to steer the first or second current to an analog output; and
a power regulator that produces the second supply voltage, wherein the power regulator responds accordingly to maintain regulation of the second supply voltage as the current from the dump node changes.

10. The DAC of claim 9, wherein the digital to analog conversion module further comprises:
a third switch operable to couple the dump node to a second supply voltage source when the at least one bit is in the first state, wherein voltage of the second supply voltage source is less than voltage of a first supply voltage source coupled to the current source.

11. The DAC of claim 10 further comprises:
a gated termination coupled to the analog output to provide a first termination when a termination selection signal is in a first state and to provide a second termination when the termination selection signal is in a second state.

12. The DAC of claim 11, wherein the gated termination comprises:
an impedance; and
a switch coupled in a series with the impedance, wherein, when the termination selection signal is in the first state, the switch is open to provide the first termination and, when the termination selection signal is in the second state, the switch is closed to provide second termination.

13. The DAC of claim 12 further comprises:
an input for receiving the termination selection signal.

14. The DAC of claim 12 further comprises:
an operating conditions module coupled to:
determine at least one operating condition of the DAC; and
generate the termination selection signal based on the at least one operating condition.

15. A method, comprising:
in response to determining a first digital to analog conversion module is in a first mode, providing a first current from a current source;
in response to determining a first digital to analog conversion module is in a second mode, providing a second current from the current source, the second current greater than the first current;
receiving a digital signal at the first digital to analog conversion module;
in response to determining a first bit of the digital signal is in a first state, steering the first current or the second current to a dump node; and
in response to determining the first bit of the digital signal is in a second state, steering the first current or the second current to an analog output; and
regulating the second supply voltage to maintain a voltage as the current from the dump node changes.

16. The method of claim 15, wherein the current source is coupled to a first supply voltage source, and farther comprising:

in response to determining the first bit of the digital signal is in the first state, coupling the dump node to a second supply voltage source.

17. The method of claim 16, wherein a voltage of the second supply voltage source is less than voltage of the first supply voltage source.

18. The method of claim 15, further comprising:

coupling the analog output to a first termination when a termination selection signal is in a first state and coupling the analog output to a second termination when the termination selection signal is in a second state.

19. The method of claim 18, further comprising:

determining at an operating condition of the DAC; and
generating the termination selection signal based on the operating condition.

20. The method of claim 15, wherein the digital signal comprises video data.

* * * * *